United States Patent
Lee et al.

(10) Patent No.: US 8,188,744 B2
(45) Date of Patent: May 29, 2012

(54) METHOD AND APPARATUS FOR DETECTING OR TRANSMITTING MAGNETIC FIELD USING DETACHABLE MAGNETIC RESONATOR

(75) Inventors: Wangjoo Lee, Daejeon (KR); Dong Ho Kim, Daejeon (KR); Jeong Ho Ju, Seoul (KR); Jae Ick Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 298 days.

(21) Appl. No.: 12/538,084

(22) Filed: Aug. 7, 2009

(65) Prior Publication Data

US 2010/0033178 A1    Feb. 11, 2010

(30) Foreign Application Priority Data

Aug. 8, 2008   (KR) .................. 10-2008-0078121

(51) Int. Cl.
*G01V 3/00* (2006.01)

(52) U.S. Cl. ...................... 324/319; 324/322

(58) Field of Classification Search .......... 324/300–322; 600/407–445
See application file for complete search history.

(56) References Cited

U.S. PATENT DOCUMENTS

| | | | |
|---|---|---|---|
| 4,620,155 A | 10/1986 | Edelstein | |
| 6,157,193 A | 12/2000 | Renz et al. | |
| 7,136,023 B2 * | 11/2006 | Reykowski | 343/742 |
| 7,804,411 B2 * | 9/2010 | Copeland | 340/572.7 |
| 7,812,729 B2 * | 10/2010 | Copeland | 340/572.7 |
| 7,924,009 B2 * | 4/2011 | Bosshard et al. | 324/318 |
| 7,970,452 B2 * | 6/2011 | Piron et al. | 600/411 |
| 2009/0231139 A1 * | 9/2009 | Heurtier | 340/572.7 |
| 2010/0109445 A1 * | 5/2010 | Kurs et al. | 307/104 |
| 2010/0127707 A1 * | 5/2010 | Lee et al. | 324/318 |
| 2011/0001620 A1 * | 1/2011 | Copeland et al. | 340/572.7 |
| 2011/0043048 A1 * | 2/2011 | Karalis et al. | 307/104 |

FOREIGN PATENT DOCUMENTS

| | | |
|---|---|---|
| JP | 7-333310 | 12/1995 |
| JP | 2006-280929 | 10/2006 |
| KR | 10-2006-0100442 | 9/2006 |

OTHER PUBLICATIONS

M. C. K. Wiltshire et al., "Microstructured Magnetic Materials for RF Flux Guides in Magnetic Resonance Imaging", Science, vol. 291, Feb. 2, 2001, pp. 849-851.

* cited by examiner

*Primary Examiner* — Brij Shrivastav
(74) *Attorney, Agent, or Firm* — Rabin & Berdo, P.C.

(57) ABSTRACT

An apparatus for detecting a magnetic field includes a coil type magnetic resonator having a resonant frequency with respect to a magnetic field varying at a particular frequency and a loop antenna inductively coupled to the coil type magnetic resonator.

31 Claims, 11 Drawing Sheets

METHOD AND APPARATUS FOR DETECTING OR TRANSMITTING MAGNETIC FIELD USING DETACHABLE MAGNETIC RESONATOR

CROSS-REFERENCE TO RELATED PATENT APPLICATION

This application claims the benefit of Korean Patent Application No. 10-2008-0078121, filed on Aug. 8, 2008, in the Korean Intellectual Property Office, the disclosure of which is incorporated herein in its entirety by reference.

BACKGROUND OF THE INVENTION

1. Field of the Invention

The present invention relates to a method and apparatus for detecting or transmitting a magnetic field, and more particularly, to a method and apparatus for detecting or transmitting a magnetic field using a detachable magnetic resonator coupled to a simple loop antenna, by which sensitivity is improved, a structure of the apparatus is simplified, and manufacturing costs are reduced.

2. Description of the Related Art

Magnetic resonance imaging (MRI) apparatuses are widely used to diagnose brain diseases, backbone diseases, bones diseases, joint diseases, cardiovascular diseases, chest diseases, congenital cardiac disorder, or myocardial infarction. The MRI apparatus is used to test the tissue type of a human body by detecting a magnetic field of a particular frequency of a hydrogen nucleus and converting a detected magnetic field to a 2D or 3D image. Compared to a computed tomography (CT) or an X-ray test, the MRI apparatus using a magnetic field that is not harmful to the human body is a non-destructive and non-radioactive test method exhibiting a superior contrast and resolution.

When a static magnetic field is applied to the human body, the hydrogen nucleus included in a cell constituent molecule of the human body has a resonant frequency proportional to the strength of the static magnetic field and well absorbs or emits electromagnetic waves of the resonant frequency.

The MRI apparatus is used to observe the interior of the human body according to the above principle. During which a strong static magnetic field of about 1 Tesla is applied to an area to be measured, the MRI apparatus applies an RF pulse wave corresponding to a resonant frequency to the human body so that the hydrogen nucleuses are excited to a high energy status. As the excited hydrogen nucleuses are restored to the original low energy status, most of the energy is externally emitted as a high frequency magnetic field in the same form of the applied RF, which is a magnetic resonance (MR) signal.

When a static magnetic field having a strength varying according to the position of the human body, for example, a gradient magnetic field in which strength increases proportionally to a distance in a particular direction from a reference point, is additionally applied during which the hydrogen nucleuses emit an RF magnetic field, the frequency of the magnetic field emitted from the hydrogen nucleuses at each position has a deviation proportional to the distance, from the center frequency determined by the static magnetic field. By receiving the MR signal using a magnetic field detection apparatus or a receiving antenna and processing the received signal, an image indicating the density distribution of the hydrogen nucleuses are obtained.

Since a more accurate diagnosis is possible as the resolution of an MR image increases, a variety of technologies to increase the resolution have been suggested. In particular, the sensitivity of an MR signal detection apparatus has a great influence on the increase of a resolution.

The MR signal is a narrow band signal and has the center frequency of about 42.6 MHz when a static magnetic field of 1 Tesla is applied. Since the strength of the static magnetic field of a currently widely used equipment is usually between 0.3 Teslas to 3 Teslas, the center frequency is usually between 13 MHz to 130 MHz, and the signal bandwidth is not greater than several hundreds kilohertz. A conventional commercial MR signal detection apparatus is a type of a band pass filtering loop antenna equipped with a resonance circuit having a high quality factor Q and an impedance matching circuit, to have a superior sensitivity characteristic with respect to the MR signal having an RF narrow band magnetic field signal.

FIG. 1A is a photo of a conventional commercial MR signal detection apparatus that is accommodated in a case. FIG. 1B is a photo of an interior circuit of the conventional commercial MR signal detection apparatus. FIG. 1C is a circuit diagram of the conventional commercial MR signal detection apparatus.

Referring to FIG. 1C, the conventional commercial MR signal detection apparatus includes a loop antenna 110 receiving an external magnetic field and a plurality of capacitors 113 and inductors 115 for resonance characteristic and impedance matching. When the strength of an external magnetic field perpendicularly penetrating the surface surrounded by the loop antenna 110 changes, a voltage signal is induced between a signal line 120 and a ground 130. The voltage signal is transmitted to a signal processing unit via a coaxial cable 140 and has a very high sensitivity at a resonant frequency.

FIG. 1D is a graph showing the frequency characteristic of a signal detected by the commercial MR signal detection apparatus at a position 10 cm apart from the a transmitting loop antenna which is driven by a network analyzer and having a flat frequency characteristic. Referring to FIG. 1D, a high transfer characteristic appears at a resonant frequency of about 42.6 MHz, which shows the characteristic of the MR signal detection apparatus when using a static magnetic field of 1 Tesla.

The conventional MR signal detection apparatus equipped with a resonance circuit has problems of a complicated circuit structure and a very high price. Also, since the conventional MR signal detection apparatus has a high sensitivity with respect to only a single narrow band signal, it is difficult to compatibly use the conventional MR signal detection apparatus with other MRI apparatuses having different strengths of static magnetic fields.

SUMMARY OF THE INVENTION

The present invention provides a method and apparatus for detecting and transmitting a magnetic field using a detachable magnetic resonator coupled to a simple loop antenna so that performance of the apparatus is superior to that of a conventional MR receiver and the apparatus may be embodied at a lower cost.

According to an aspect of the present invention, there is provided an apparatus for detecting a magnetic field which includes a coil type magnetic resonator having a resonant frequency with respect to a magnetic field varying at a particular frequency, and a loop antenna inductively coupled to the coil type magnetic resonator.

According to another aspect of the present invention, there is provided an apparatus for detecting a magnetic field which includes a plurality of coil type magnetic resonators having different resonant frequencies, and a loop antenna inductively coupled to the coil type magnetic resonators.

According to another aspect of the present invention, there is provided a method of detecting a magnetic field which includes generating resonance in a coil type magnetic resonator according to a magnetic field that is linked to the coil type magnetic resonator and varies at a resonant frequency of the coil type magnetic resonator, and detecting the magnetic field using a loop antenna inductively coupled to the coil type magnetic resonator.

According to another aspect of the present invention, there is provided a method of transmitting a magnetic field which includes generating a time-varying magnetic field by applying a current that varies at a resonant frequency of a coil type magnetic resonator to a loop antenna, and generating resonance in the coil type magnetic resonator inductively coupled to the loop antenna by the time-varying magnetic field.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
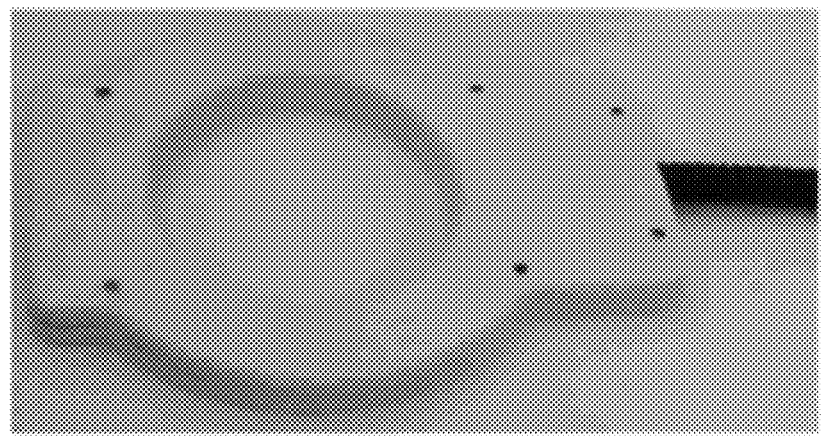
FIG. 1A is a photo of an example of a conventional commercial MR signal detection apparatus that is accommodated in a case.
Figure 1B:
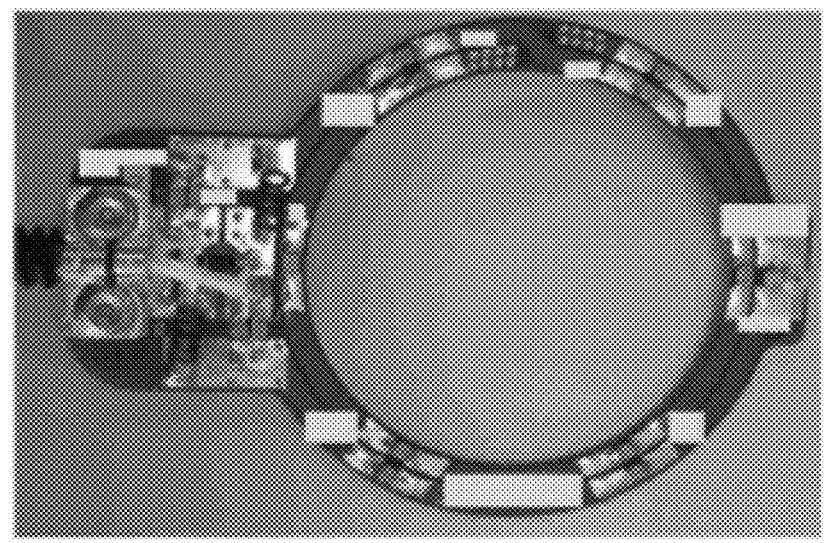
FIG. 1B is a photo of an example of an interior circuit of the conventional commercial MR signal detection apparatus.

The present invention will now be described more fully with reference to the accompanying drawings, in which exemplary embodiments of the invention are shown. The attached drawings for illustrating preferred embodiments of the present invention are referred to in order to gain a sufficient understanding of the present invention, the merits thereof, and the objectives accomplished by the implementation of the present invention. Hereinafter, the present invention will be described in detail by explaining preferred embodiments of the invention with reference to the attached drawings. Like reference numerals in the drawings denote like elements.

Compared to a conventional commercial magnetic resonance (MR) signal detection apparatus equipped with a complicated resonance circuit, in the present invention, a magnetic field detection apparatus that has a high sensitivity of low cost circuit is embodied by inductively coupling a magnetic resonator to an inexpensive and simple loop antenna. The inductive coupling or magnetic coupling signifies that, when two circuits share magnetic flux linkage and the current flowing in one of the circuits varies so that time-varying magnetic flux is generated, a voltage is induced in the other circuit due to mutual inductance.

The magnetic resonator is a device that receives an external magnetic field varying at the resonant frequency and amplifies the received magnetic field to generate a larger magnetic field. A widely known magnetic resonator is a coil (solenoid) formed by winding a metal wire. The coil is an L-C resonant circuit including an inductive component L and a capacitive component C. The resonant frequency $f_r$ is expressed by Equation 1.

$$f_r = \frac{1}{2\pi\sqrt{LC}} \quad \text{[Equation 1]}$$

Figure 2A:
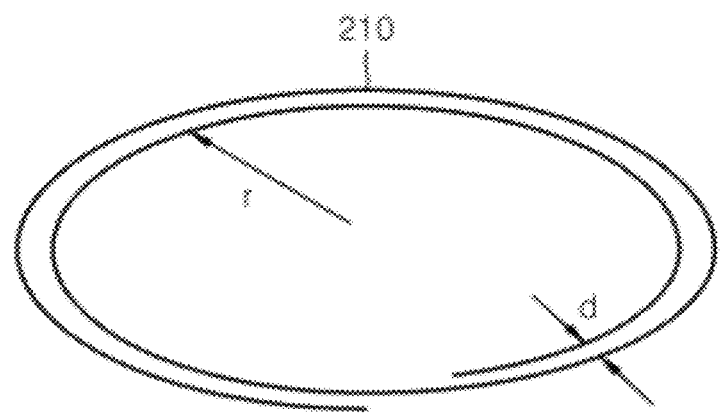
FIG. 2A schematically illustrates the shape of a coil type magnetic resonator according to an embodiment of the present invention.

FIG. 2A schematically illustrates the shape of a coil type magnetic resonator according to an embodiment of the present invention. Referring to FIG. 2A, a coil type magnetic resonator 210 is formed by winding a metal wire at least one turn. Both ends of the metal wire may not be connected to each other or may be connected using a separate capacitor device.

Figure 2B:
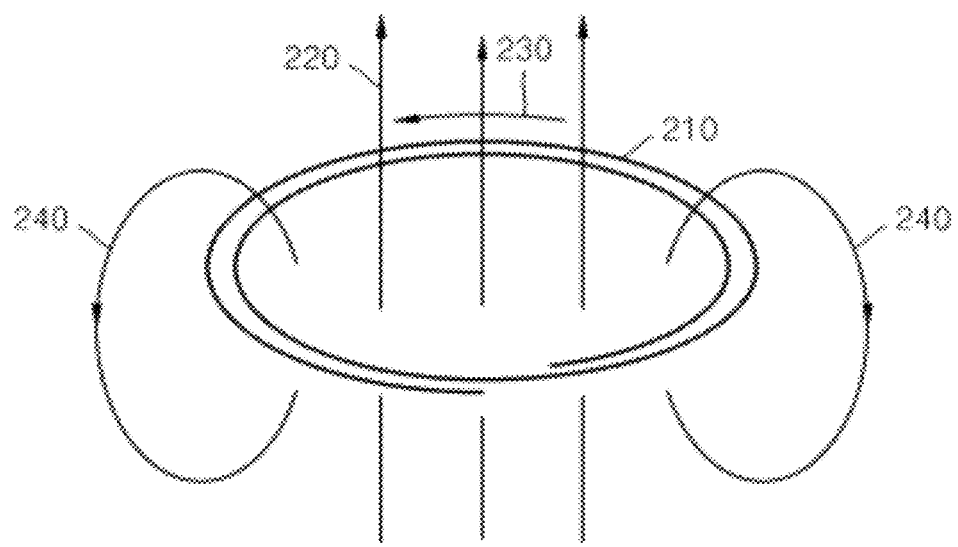
FIG. 2B illustrates the operation principle of the coil type magnetic resonator shown in FIG. 2A.

FIG. 2B illustrates the operation principle of the coil type magnetic resonator shown in FIG. 2A. Referring to FIG. 2B, as the strength of an external magnetic field 220 passing in the axial direction, that is, in the direction perpendicular to the surface formed by the coil, changes, an inductive current 230 flows in the coil type magnetic resonator 210 according to the Lenz's law to generate an inductive magnetic field 240. Since the strength of the inductive current is greatly increased at around the resonant frequency, the inductive magnetic field 240 is increased so that the strength of the overall magnetic field increases very much.

The resonant frequency of the coil type magnetic resonator 210 may be adjusted according to Equation 1 by adjusting the inductance and capacitance. The inductance may be adjusted by changing the thickness of the metal wire, the number of windings, or the shape of the coil, that is, the diameter "r" or winding shape of the coil. The capacitance may be adjusted by changing the interval "d" between the turns of the metal wire and the dielectric surrounding the metal wire. When both ends of the metal wire are connected by a capacitor, the capacitance may be adjusted by changing the capacitor or using a variable capacitor.

Figure 3:
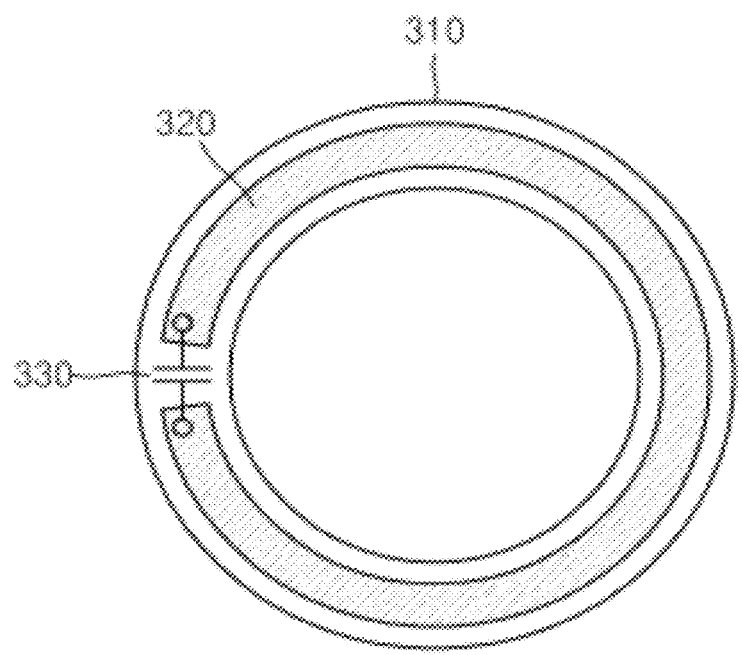
FIG. 3 illustrates an example of the coil type magnetic resonator manufactured on a PCB according to an embodiment of the present invention.

FIG. 3 illustrates a coil type magnetic resonator manufactured on a PCB according to another embodiment of the present invention. Referring to FIG. 3, in a coil type magnetic resonator according to the present embodiment, a metal pattern 320 having a ring shape is formed on a PCB 310 instead of a metal wire and both ends of the metal pattern 320 are connected by a capacitor 330. A metal pattern of a ring shape wound several turns may be formed by using a multilayer PCB.

Figure 4:
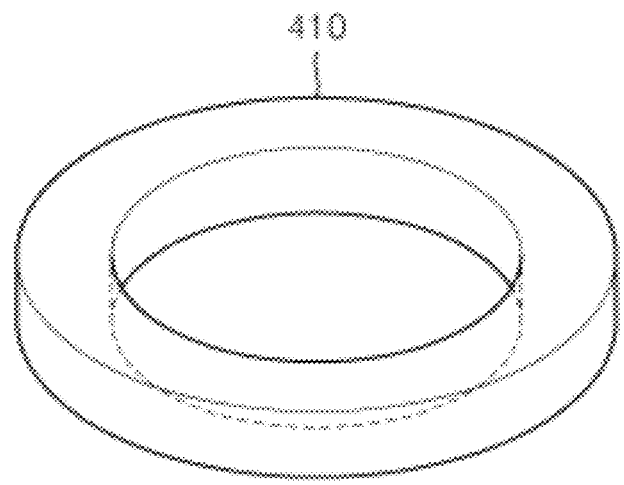
FIG. 4 schematically illustrates an example of a case accommodating the magnetic resonator according to an embodiment of the present invention.

FIG. 4 schematically illustrates an example of a case accommodating the magnetic resonator according to an embodiment of the present invention. Referring to FIG. 4, for the convenience of usage and the stability of resonant frequency, the coil type magnetic resonator 210 may be inserted in a case 410 formed of a non-magnetic material such as plastic to prevent deformation of a shape.

When the coil type magnetic resonator 210 described above is inductively coupled to a loop antenna having a wideband characteristic of a low sensitivity and a flat frequency characteristic in a band in use, a magnetic field detection apparatus having a high sensitivity at a particular frequency may be obtained. In the magnetic field detection apparatus, the coil type magnetic resonator 210 amplifies a magnetic field of a particular frequency so that the loop antenna outputs a large detection signal. Using this method, a magnetic field detection apparatus having a high sensitivity and a simple structure may be embodied at a low cost. The loop antenna may be accommodated in a separate case (not shown) from that of the coil type magnetic resonator 210, so that the coil type magnetic resonator 210 and the loop antenna may be detachable from each other.

Figure 1C:
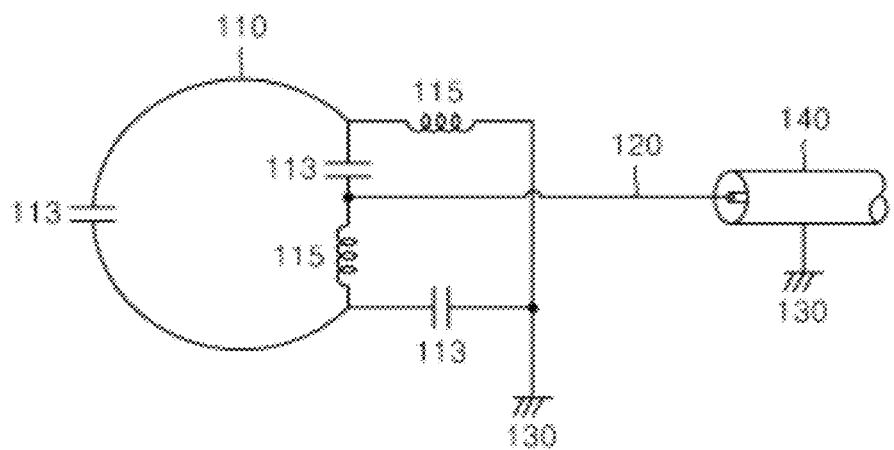
FIG. 1C is an example of a circuit diagram of the conventional commercial MR signal detection apparatus.
Figure 5A:
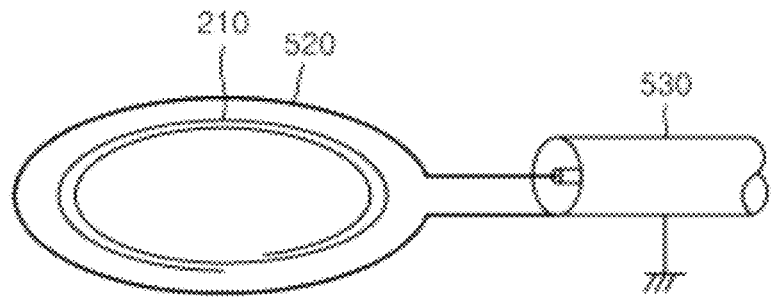
FIG. 5A schematically illustrates a magnetic field detection apparatus according to an embodiment of the present invention in which a loop antenna and a magnetic resonator having a diameter smaller than that of the loop antenna are arranged on the same plane and inductively coupled to each other.
Figure 5B:
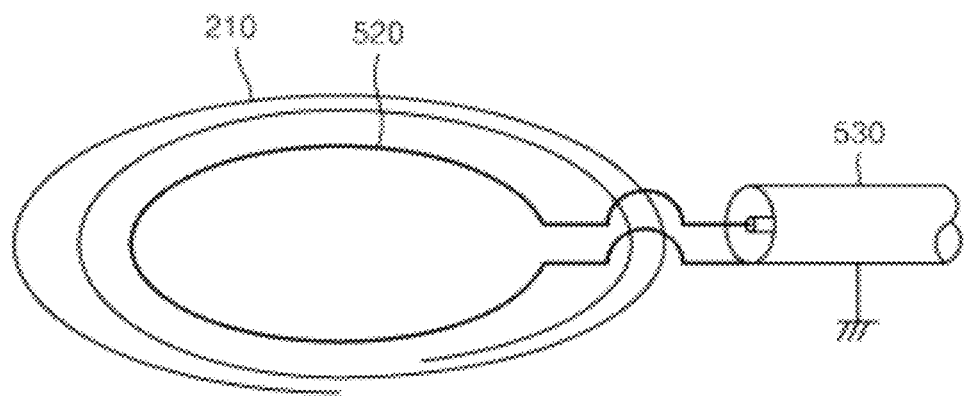
FIG. 5B schematically illustrates a magnetic field detection apparatus according to an embodiment of the present invention in which a loop antenna and a magnetic resonator having a diameter larger than that of the loop antenna are arranged on the same plane and inductively coupled to each other.
Figure 5C:
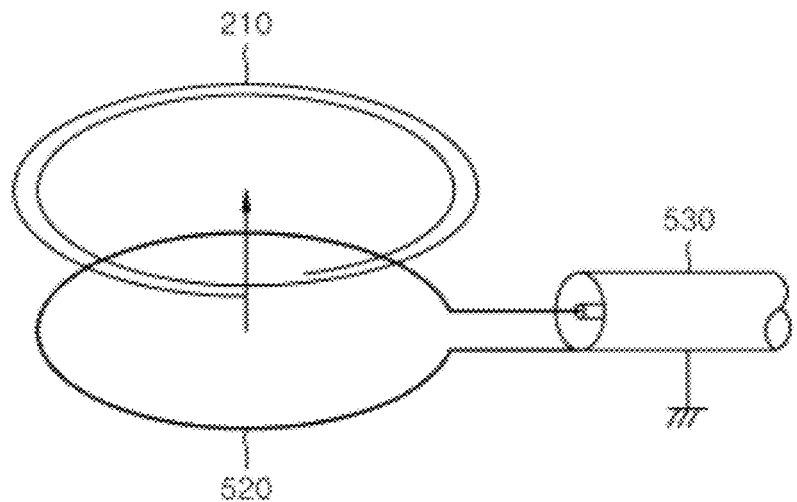
FIG. 5C schematically illustrates a magnetic field detection apparatus according to an embodiment of the present invention in which a loop antenna and a magnetic resonator are arranged on different planes and inductively coupled to each other.

FIGS. 5A-5C illustrate embodiments of a magnetic field detection apparatus in which a loop antenna 520 formed by winding a metal wire only one time is inductively coupled to the coil type magnetic resonator 210. Since a separate inductor or a complicated circuit is not used and a simple wideband loop antenna is used, compared to the conventional commercial MR signal detection apparatus of FIG. 1C, a manufacturing cost may be greatly reduced. In the Figures, cases for accommodating the coil type magnetic resonator 210 and the loop antenna 520 are omitted for the convenience of explanation.

FIG. 5A illustrates an example in which the loop antenna 520 and the coil type magnetic resonator 210 having a diameter smaller than that of the loop antenna 520 are arranged on the same plane. FIG. 5B illustrates another example in which the loop antenna 520 and the coil type magnetic resonator 210 having a diameter larger than that of the loop antenna 520 are arranged on the same plane. FIG. 5C illustrates another embodiment in which the coil type magnetic resonator 210 is arranged on a plane that is separated a distance "h" from and parallel to the plane on which the loop antenna 520 is located. Since an MRI apparatus may measure a variety of areas, an appropriate arrangement may be used according to an object to be measured. A voltage signal induced in the loop antenna 520 is transmitted to a subsequent signal processing unit such as an amplifier via a coaxial cable 530.

Figure 6A:
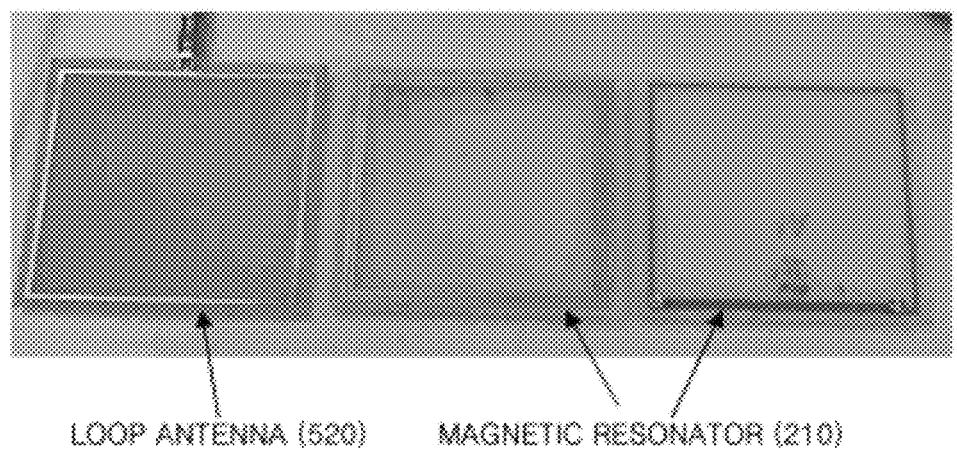
FIG. 6A is a photo of the loop antenna and magnetic resonators according to an embodiment of the present invention.
Figure 6B:
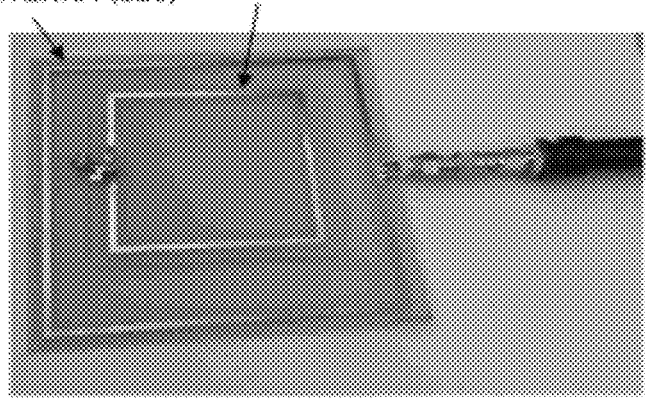
FIG. 6B is a photo showing that a loop antenna and a magnetic resonator smaller than the loop antenna are arranged on the same plane.
Figure 6C:
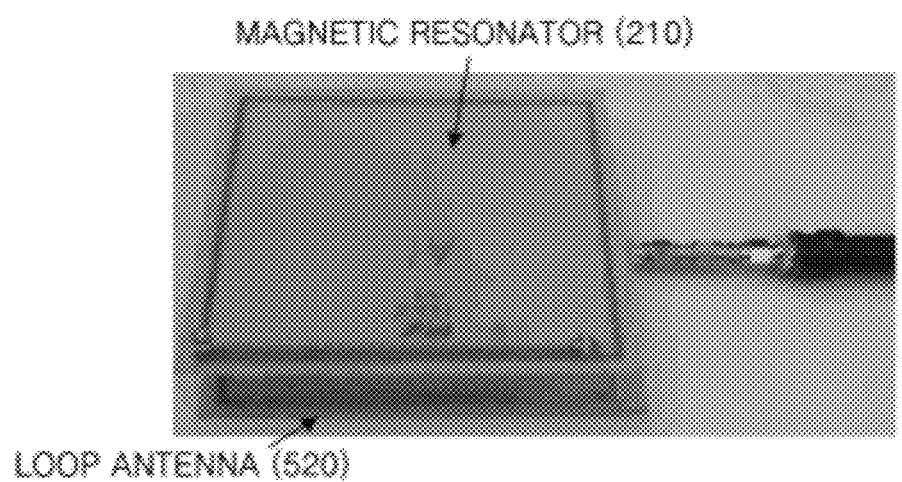
FIG. 6C is a photo showing that a magnetic resonator is arranged on a plane separated from and parallel to the plane where a loop antenna is positioned.

FIGS. 6A-6C are photos of a magnetic field detection apparatus according to an embodiment of the present invention. FIG. 6A is a photo of the loop antenna 520 and the coil type magnetic resonators 210 according to an embodiment of the present invention. FIG. 6B is a photo showing that the loop antenna 520 and the coil type magnetic resonator 210 smaller than the loop antenna 520 are arranged on the same plane. FIG. 6C is a photo showing that the coil type magnetic resonator 210 is arranged on a plane separated from and parallel to the plane where the loop antenna 520 is positioned.

Figure 1D:
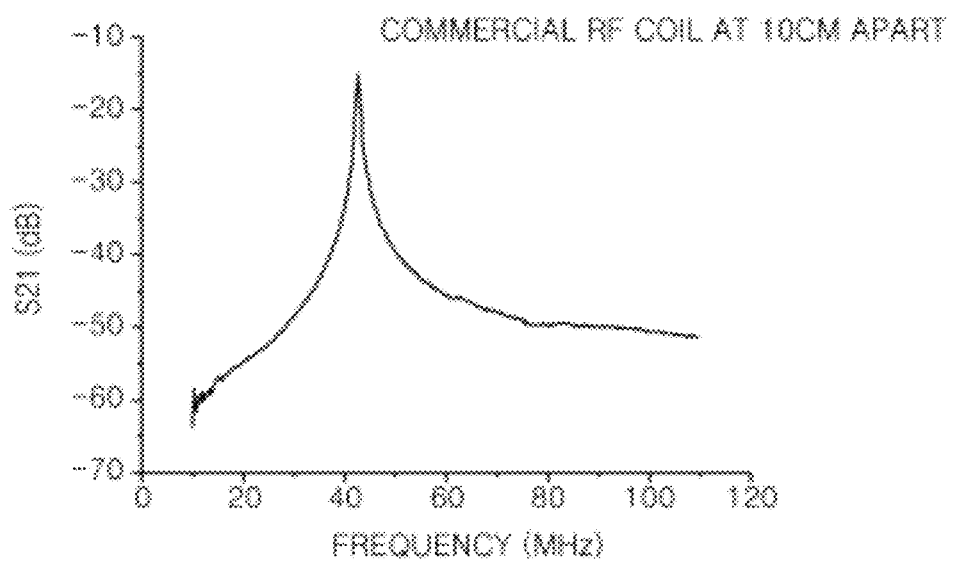
FIG. 1D is a graph showing an example of the frequency characteristic of the conventional commercial MR signal detection apparatus circuit.
Figure 7A:
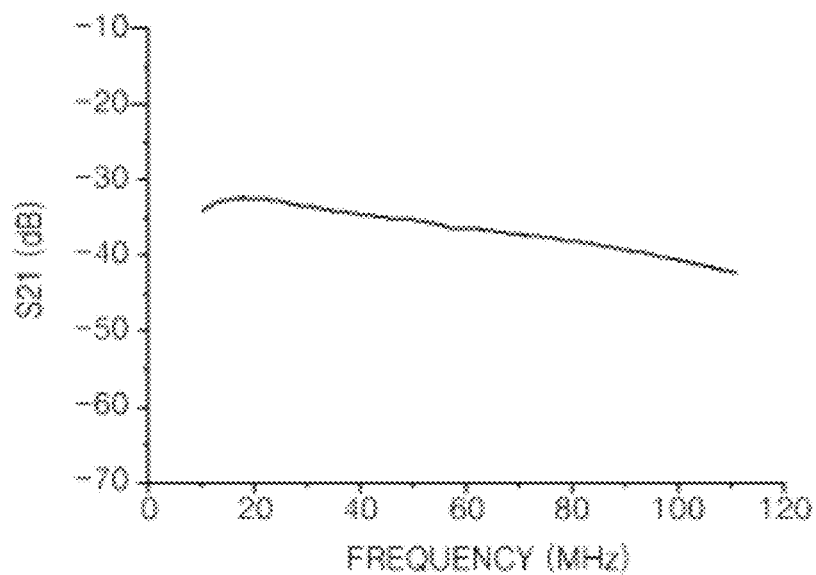
FIG. 7A is a graph showing a frequency characteristic when only the loop antenna of the present invention is used.
Figure 7B:
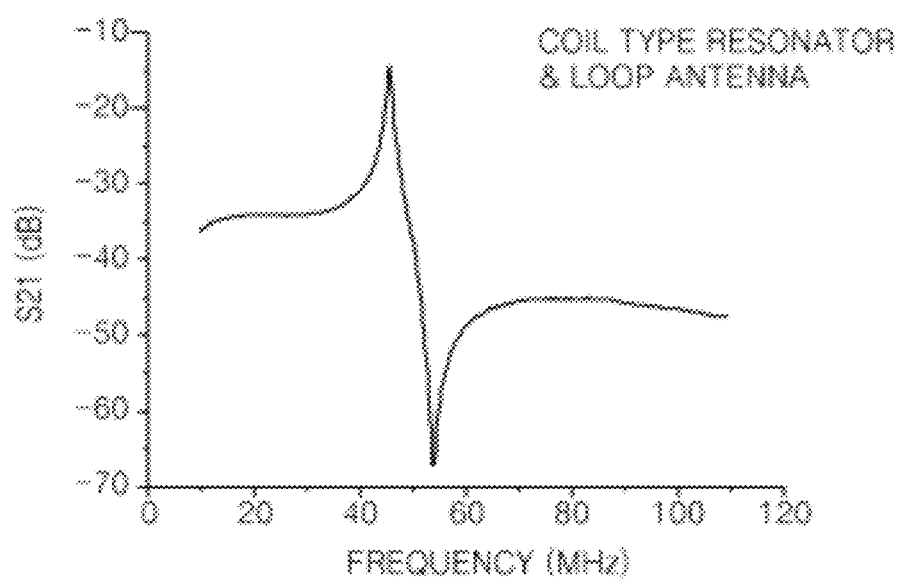
FIG. 7B is a graph showing the frequency characteristic of a magnetic field detection apparatus according to an embodiment of the present invention in which a loop antenna and a magnetic resonator are arranged on the same plane and inductively coupled to each other.

FIGS. 7A and 7B are graphs showing the frequency characteristic of a magnetic field detection apparatus according to an embodiment of the present invention. As in the measurement of the characteristic of the commercial MR signal detection apparatus in FIG. 1D, a magnetic field is generated by driving a transmission antenna having a flat frequency characteristic using a network analyzer and a transfer characteristic S21 according to the frequency is measured at a place vertically separated 10 cm from the plane of a transmission antenna.

FIG. 7A is a graph showing a frequency characteristic when only the loop antenna 520 of the present invention is used. Referring to FIG. 7A, sensitivity is very low and a gain characteristic is relatively flat. FIG. 7B is a graph showing the frequency characteristic of a magnetic field detection apparatus according to an embodiment of the present invention in which the loop antenna 520 and the coil type magnetic resonator 210 are arranged on the same plane and inductively coupled to each other. Referring to FIG. 7B, sensitivity is nearly the same as the commercial MR signal detection apparatus at the resonant frequency.

Another aspect of the magnetic field detection apparatus according to the present invention is that a frequency band having a high sensitivity can be changed by simply replacing the coil type magnetic resonator 210 without changing the loop antenna 520.

Figure 8A:
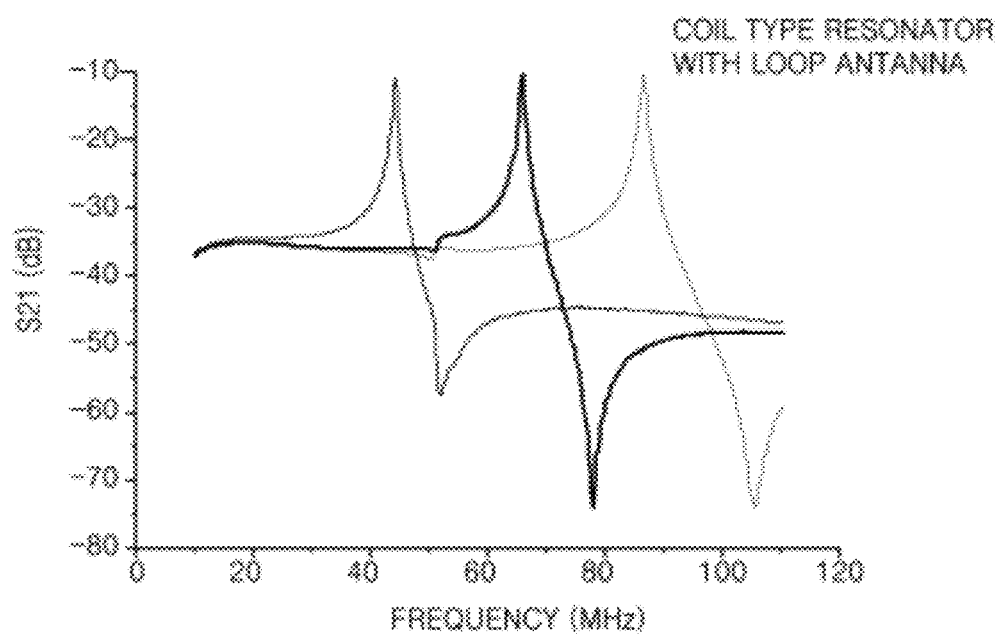
FIG. 8A is a graph showing the frequency characteristic of a magnetic field detection apparatus according to an embodiment of the present invention in which coil type magnetic resonators having different resonant frequencies are inductively coupled to a loop antenna alternately.

FIG. 8A is a graph showing the frequency characteristic of a magnetic field detection apparatus according to an embodiment of the present invention in which the coil type magnetic resonators 210 having different resonant frequencies are inductively coupled to the loop antenna 520 alternately. Referring to FIG. 8A, the frequency band having a high sensitivity can be changed by simply replacing the coil type magnetic resonator 210.

Figure 8B:
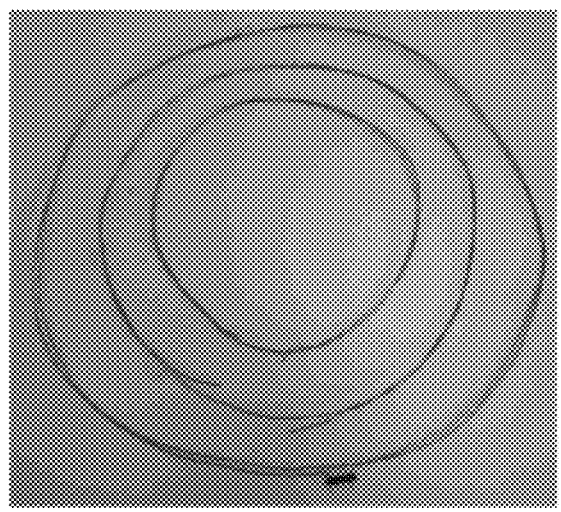
FIG. 8B is a photo of the coil type magnetic resonators having different resonant frequencies used for the measurement of FIG. 8A.
Figure 8C:
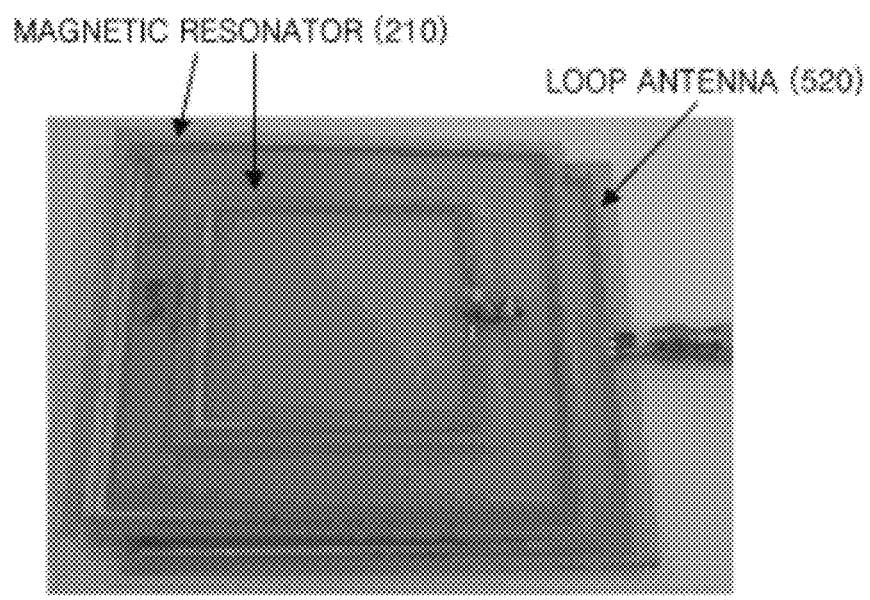
FIG. 8C is a photo showing that a plurality of magnetic resonators are inductively coupled to the loop antenna simultaneously according to an embodiment of the present invention.

FIG. 8B is a photo of three coil type magnetic resonators having different resonant frequencies used for the measurement of FIG. 8A. By inductively coupling the coil type magnetic resonators 210 having different resonant frequencies to the loop antenna 520 simultaneously, a magnetic field detection apparatus having a high sensitivity in a plurality of frequency bands may be obtained. When the resonant frequencies of the coil type magnetic resonators 210 are too closely arranged, the resonance characteristic may be distorted due to the interference between the coil type magnetic resonators 210. To address the problem, a difference in terms of space or frequency may be given. When a plurality of resonators are used, the interference is negligibly small if a difference between the resonant frequencies is not too small. In particular, for an MRI apparatus, since one center frequency is used, the interference is basically not occurred. FIG. 8C is a photo showing that the coil type magnetic resonators 210 are inductively coupled to the loop antenna 520 simultaneously according to an embodiment of the present invention.

Figure 9:
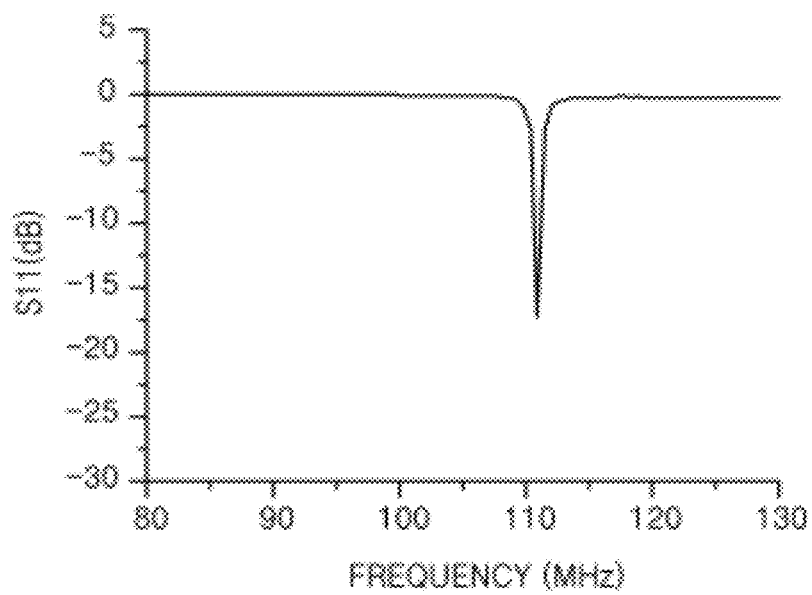
FIG. 9 is a graph showing the frequency characteristic of a magnetic field generating antenna according to an embodiment of the present invention in which a loop antenna and a magnetic resonator are inductively coupled to each other.

In another embodiment of the magnetic field detection apparatus of the present invention, according to the general reciprocity theorem of electromagnetics, when a receiving antenna having a high detection sensitivity at a particular frequency is used as a transmitting antenna, a high radiation efficiency can be obtained at the frequency. FIG. 9 is a graph showing the characteristic of a transmitting antenna having the same structure of FIG. 5A in which the loop antenna 520 and the coil type magnetic resonator 210 having a resonant frequency of 111 MHz are inductively coupled to each other.

Referring to FIG. 9, the S11 indicating a reflection component at the resonant frequency is greatly reduced which signifies that the radiation efficiency of an antenna is greatly increased. Thus, the magnetic field detection apparatus according to the present invention may be used as a transmission antenna having a high magnetic field radiation efficiency.

Figure 10:
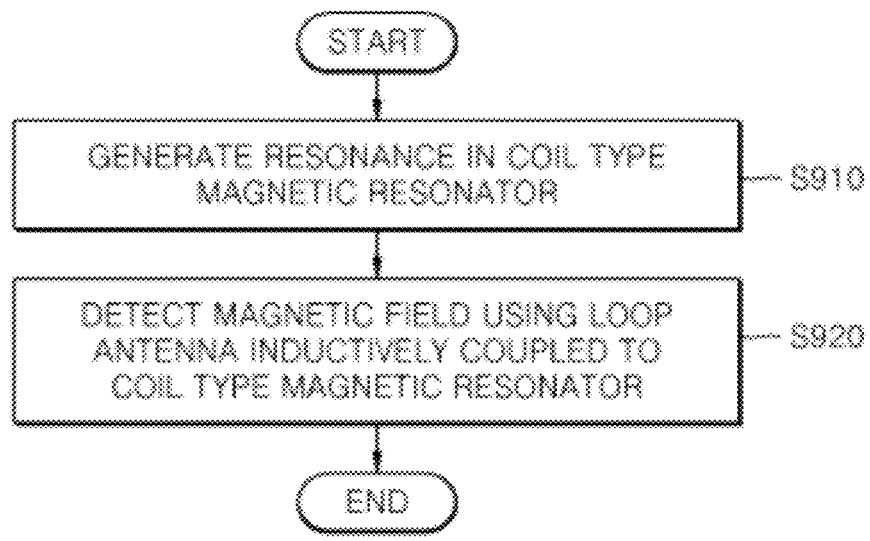
FIG. 10 is a flowchart showing the flow of a magnetic field detection method using a magnetic resonator according to an embodiment of the present invention.

FIG. 10 is a flowchart showing the flow of a magnetic field detection method using a magnetic resonator according to an embodiment of the present invention. Referring to FIG. 10, resonance is generated in the coil type magnetic resonator 210 when a magnetic field 230 linked to the coil type magnetic resonator 210 varies at the resonant frequency of the coil type magnetic resonator 210 (S910). The resonating magnetic field 230 is detected using the loop antenna 520 inductively coupled to the coil type magnetic resonator 210 (S920).

To increase mutual inductance between the coil type magnetic resonator 210 and the loop antenna 520, the coil type magnetic resonator 210 and the loop antenna 520 are arranged on the same plane or on the different planes parallel to each other with the centers aligned. Also, the resonant frequency may be adjusted by changing the shape of the coil of the coil type magnetic resonator 210, that is, the diameter, the winding shape, or the winding number of the coil, or the interval between turns of the metal wire, replacing or adjusting the capacitance of the variable capacitor 330.

Figure 11:
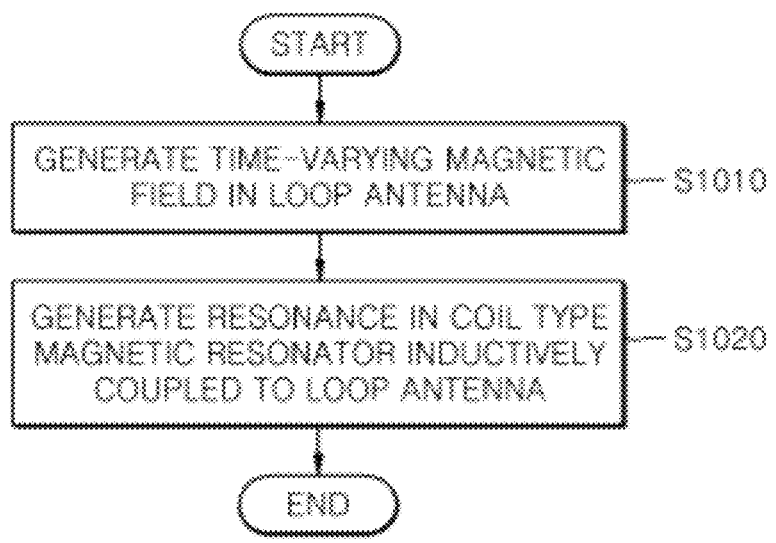
FIG. 11 is a flowchart showing the flow of a magnetic field generating method using a magnetic resonator according to an embodiment of the present invention.

FIG. 11 is a flowchart showing the flow of a magnetic field generating method using a magnetic resonator according to an embodiment of the present invention. Referring to FIG. 11, a time-varying magnetic field is generated in the loop antenna 500 by applying a current varying at the resonant frequency of the coil type magnetic resonator 210 to the loop antenna 520 (S1010). Resonance is generated in the coil type magnetic resonator 210 that is inductively coupled to the loop antenna 520 by the time-varying magnetic field (S1020).

To increase the mutual inductance between the loop antenna 520 and the coil type magnetic resonator 210, the loop antenna 520 and the coil type magnetic resonator 210 are arranged on the same plane or on the different planes parallel to each other with the centers aligned. Also, the resonant frequency may be adjusted by changing the shape of the coil of the coil type magnetic resonator 210, that is, the diameter, the winding shape, or the winding number of the coil, or the interval between the turns of the metal wire, replacing or adjusting the capacitance of the variable capacitor 330.

Thus, the magnetic detection apparatus according to the present invention is advantageous in that, compared to the conventional MR signal detection apparatus, the structure is simple, the sensitivity is high, and the manufacturing cost is low. Also, the resonant frequency can be easily changed by replacing the coil type magnetic resonator 210, and thus, the magnetic field detection apparatus may be used for an MRI apparatus having a different strength of a static magnetic field. In addition, the present invention provides a magnetic field generating method having a high efficiency and a low price.

As described above, the present invention provides an MR signal detection or generating apparatus having a simple structure and a high sensitivity at a low cost which can be widely used for detecting or transmitting a narrow band RF magnetic field instead of a conventional expensive MR signal detection apparatus. Also, a magnetic field detection apparatus according to the present invention may be used for different MRI apparatuses having different strengths of static magnetic fields by replacing a detachable magnetic resonator. Furthermore, according to the present invention, the MRI apparatuses may be manufactured at a very low cost and an MRI photographing cost may also be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for detecting a magnetic field, the apparatus comprising:
    a coil type magnetic resonator having a resonant frequency with respect to a magnetic field varying at a particular frequency, and amplifying a strength of a magnetic field applied to the coil type magnetic resonator, the coil type magnetic resonator being formed of a coil wound at least one turn without discontinuity or a pattern of a ring shape extending from one end to the other end without discontinuity; and
    a loop antenna inductively coupled to the coil type magnetic resonator, the loop antenna detecting the magnetic field amplified by the coil type magnetic resonator based on a voltage in the loop antenna induced by a change in a current in the coil type magnetic resonator.

2. The apparatus of claim 1, wherein the loop antenna has a wideband characteristic.

3. The apparatus of claim 1, wherein the coil type magnetic resonator and the loop antenna are arranged on a same plane or on different planes parallel to each other.

4. The apparatus of claim 1, further comprising:
    a case formed of a non-magnetic material for accommodating the coil type magnetic resonator; and
    a case formed of a non-magnetic material for accommodating the loop antenna.

5. The apparatus of claim 4, wherein the case for accommodating the coil type magnetic resonator is mechanically coupled to or is detachable from the case for accommodating the loop antenna.

6. The apparatus of claim 1, wherein the coil type magnetic resonator is formed of a non-magnetic material.

7. The apparatus of claim 6, wherein the coil type magnetic resonator is formed of a coil obtained by winding a non-magnetic metal wire at least one turn.

8. The apparatus of claim 7, wherein the resonant frequency of the coil type magnetic resonator is adjustable by changing a shape of the coil.

9. The apparatus of claim 6, wherein the coil type magnetic resonator is formed of a non-magnetic metal pattern of a ring shape on a printed circuit board.

10. The apparatus of claim 1, wherein the coil type magnetic resonator comprises a replaceable capacitor or a variable capacitor for adjusting the resonance frequency.

11. An apparatus for detecting a magnetic field, the apparatus comprising:
a plurality of coil type magnetic resonators having different resonant frequencies, and amplifying a strength of a magnetic field applied to the coil type magnetic resonator, each coil type magnetic resonator being formed of a coil wound at least one turn without discontinuity or a pattern of a ring shape extending from one end to the other end without discontinuity; and
a loop antenna inductively coupled to the coil type magnetic resonators, the loop antenna detecting the magnetic field amplified by the coil type magnetic resonator based on a voltage in the loop antenna induced by a change in a current in the coil type magnetic resonator.

12. The apparatus of claim 11, wherein the loop antenna has a wideband characteristic.

13. The apparatus of claim 11, wherein the coil type magnetic resonators and the loop antenna are arranged on a same plane or on different planes parallel to each other.

14. The apparatus of claim 11, further comprising:
a case formed of a non-magnetic material for accommodating the coil type magnetic resonators; and
a case formed of a non-magnetic material for accommodating the loop antenna.

15. The apparatus of claim 14, wherein the case for accommodating the coil type magnetic resonators is mechanically coupled to or is detachable from the case for accommodating the loop antenna.

16. The apparatus of claim 11, wherein each of the coil type magnetic resonator is formed of a non-magnetic material.

17. The apparatus of claim 16, wherein each of the coil type magnetic resonators is formed of a coil obtained by winding a non-magnetic metal wire at least one turn.

18. The apparatus of claim 17, wherein the resonant frequency of each of the coil type magnetic resonators is adjustable by changing a shape of the coil.

19. The apparatus of claim 16, wherein each of the coil type magnetic resonators is formed of a non-magnetic metal pattern of a ring shape on a printed circuit board.

20. The apparatus of claim 11, wherein each of the coil type magnetic resonators comprises a replaceable capacitor or a variable capacitor for adjusting the resonance frequency.

21. A method of detecting a magnetic field, the method comprising:
generating resonance in a coil type magnetic resonator according to a magnetic field that is linked to the coil type magnetic resonator and varies at a resonant frequency of the coil type magnetic resonator, wherein the coil type magnetic resonator amplifies a strength of the magnetic field linked to the coil type magnetic resonator and is formed of a coil wound at least one turn without discontinuity or a pattern of a ring shape extending from one end to the other end without discontinuity; and
detecting the magnetic field amplified by the coil type magnetic resonator using a loop antenna inductively coupled to the coil type magnetic resonator, based on a voltage in the loop antenna induced by a change in a current in the coil type magnetic resonator.

22. The method of claim 21, wherein the loop antenna has a wideband characteristic.

23. The method of claim 21, wherein the coil type magnetic resonator and the loop antenna are arranged on a same plane or on different planes parallel to each other.

24. The method of claim 21, wherein the coil type magnetic resonator is formed of a non-magnetic material.

25. The method of claim 24, wherein the coil type magnetic resonator is formed of a coil obtained by winding a non-magnetic metal wire at least one turn.

26. The method of claim 24, wherein the coil type magnetic resonator is formed of a non-magnetic metal pattern of a ring shape on a printed circuit board.

27. The method of claim 21, wherein the coil type magnetic resonator comprises a replaceable capacitor or a variable capacitor, and the method further comprises adjusting the resonant frequency by replacing the replaceable capacitor or adjusting capacitance of the variable capacitor.

28. A method of transmitting a magnetic field, the method comprising:
generating a time-varying magnetic field by applying a current that varies at a resonant frequency of a coil type magnetic resonator to a loop antenna, wherein the coil type magnetic resonator is formed of a coil wound at least one turn without discontinuity or a pattern of a ring shape extending from one end to the other end without discontinuity; and
generating resonance in the coil type magnetic resonator inductively coupled to the loop antenna by the time-varying magnetic field.

29. The method of claim 28, wherein the loop antenna has a wideband characteristic.

30. The apparatus of claim 1, wherein the coil type magnetic resonator and the loop antenna are arranged on a same plane or on different planes parallel to each other, and a center of the coil type magnetic resonator and a center of the loop antenna are aligned.

31. The apparatus of claim 1, wherein the loop antenna is a single metal wire having two ends, the loop antenna being wound at least one turn extending from one end to the other end without discontinuity.

* * * * *